United States Patent
Lee et al.

(10) Patent No.: US 11,097,943 B2
(45) Date of Patent: Aug. 24, 2021

(54) METHOD FOR FABRICATING A MEMBRANE DEVICE INCLUDING MEMBRANE HAVING WRINKLES FORMED ALONG TRENCHES

(71) Applicant: KOREA INSTITUTE OF SCIENCE AND TECHNOLOGY, Seoul (KR)

(72) Inventors: Byung Chui Lee, Seoul (KR); Jin Soo Park, Seoul (KR); Mintack Oh, Seoul (KR); Jin Hyun Kim, Seoul (KR)

(73) Assignee: Korea Institute of Science and Technology, Seoul (KR)

(*) Notice: Subject to any disclaimer, the term of this patent is extended or adjusted under 35 U.S.C. 154(b) by 0 days.

(21) Appl. No.: 16/294,032

(22) Filed: Mar. 6, 2019

(65) Prior Publication Data
US 2019/0322524 A1    Oct. 24, 2019

(30) Foreign Application Priority Data

Apr. 24, 2018 (KR) .......................... 10-2018-0047184

(51) Int. Cl.
*B81C 1/00* (2006.01)
*H01L 41/09* (2006.01)
(Continued)

(52) U.S. Cl.
CPC ...... *B81C 1/00158* (2013.01); *B81C 1/00182* (2013.01); *H01L 21/76254* (2013.01); *H01L 41/098* (2013.01); *H01L 41/0926* (2013.01); *H01L 41/0973* (2013.01); *H01L 41/1138* (2013.01); *B81B 2201/0264* (2013.01); *H01L 29/7847* (2013.01)

(58) Field of Classification Search
CPC ............ H01L 29/7847; H01L 41/0926; H01L 41/0973; H01L 41/098; H01L 41/1138; H01L 21/76254; B81C 1/00158; B81C 1/00182; B81B 2201/0264
See application file for complete search history.

(56) References Cited

U.S. PATENT DOCUMENTS 5,719,073 A * 2/1998 Shaw .................. B81C 1/00142
                                                148/DIG. 50
2002/0106867 A1* 8/2002 Yang .................. H01L 21/2007
                                                438/458

(Continued)

FOREIGN PATENT DOCUMENTS

JP        06331471 A  * 12/1994
KR    10-1371342 B1     3/2014
KR    10-1720281 B1     4/2017

*Primary Examiner* — Eduardo A Rodela
*Assistant Examiner* — Christopher M Roland
(74) *Attorney, Agent, or Firm* — Rabin & Berdo, P.C.

(57) ABSTRACT

A membrane device includes a trench substrate having trenches and a membrane having wrinkles. The membrane is not bonded to the trenches of the trench substrate but is bonded to the surface of the trench substrate in the shoulders of the trenches. Hills and valleys are alternately arranged in the membrane along the trenches. The membrane device can be used in various applications (for example, sensors) based on variations in the electrical properties of the membrane caused by a change in the shape of the wrinkles (a change in the strain) of the membrane in response to a change in the internal or external environment of the trenches.

7 Claims, 11 Drawing Sheets

(51) Int. Cl.
*H01L 41/113* (2006.01)
*H01L 21/762* (2006.01)
*H01L 29/78* (2006.01)

(56) References Cited

U.S. PATENT DOCUMENTS

| | | | | |
|---|---|---|---|---|
| 2006/0057816 | A1* | 3/2006 | Benzel | G01L 9/0045 438/424 |
| 2008/0012909 | A1* | 1/2008 | Matsuda | H01L 41/0973 347/68 |
| 2012/0248063 | A1* | 10/2012 | De Brabander | B81B 3/0021 216/36 |
| 2013/0069195 | A1* | 3/2013 | Suguro | H01L 21/76254 257/506 |
| 2015/0086301 | A1* | 3/2015 | Rogers | H01L 21/6838 414/217 |

* cited by examiner

METHOD FOR FABRICATING A
MEMBRANE DEVICE INCLUDING
MEMBRANE HAVING WRINKLES FORMED
ALONG TRENCHES

CROSS-REFERENCE TO RELATED
APPLICATIONS

This application claims priority under 35 U.S.C. § 119 to Korean Patent Application No. 10-2018-0047184 filed on Apr. 24, 2018 in the Korean Intellectual Property Office, the disclosure of which is incorporated herein by reference in its entirety.

BACKGROUND OF THE INVENTION

1. Field of the Invention

The present invention relates to a membrane device and a method for fabricating the same. More particularly, the present invention relates to a membrane device including a membrane having wrinkles formed along trenches and a method for fabricating the membrane device. The present invention also relates to applications of the membrane device in various fields, including sensors and lasers.

2. Description of the Related Art

Stress applied to a material causes strain, leading to distortion in lattice structure. This distortion affects the electrical properties of the material, including charge mobility and energy band gap.

For example, the application of a strain to a semiconductor changes the energy band gap from indirect to direct.

The use of nanomembranes has been introduced in filters (see, for example, Korean Patent No. 1371342, published on Mar. 10, 2014) and sensors (see, for example, Korean Patent No. 1720281, published on Apr. 10, 2017). However, no technology has been reported on the use of wrinkled membranes.

SUMMARY OF THE INVENTION

Therefore, it is one object of the present invention to provide a membrane device including a membrane having wrinkles formed along trenches that can be used in various applications (for example, sensors) based on variations in the electrical properties of the membrane caused by a change in the shape of the wrinkles (a change in the strain) of the membrane in response to a change in the internal or external environment of the trenches. It is a further object of the present invention to provide a method for fabricating the membrane device. It is another object of the present invention to provide various applied products of the membrane device.

A membrane device according to one aspect of the present invention includes a trench substrate having trenches and a membrane having wrinkles wherein the membrane is not bonded to the trenches of the trench substrate but is bonded to the surface of the trench substrate in the shoulders of the trenches and wherein hills and valleys are alternately arranged in the membrane along the trenches.

A method for fabricating a membrane device according to a further aspect of the present invention includes: forming a membrane on a handling substrate; bonding the handling substrate to a trench substrate having trenches under vacuum in a state in which the membrane faces the trench substrate such that the trenches are evacuated to a vacuum; annealing the resulting vacuum-bonded structure; separating and removing the handling substrate from the membrane; and removing the vacuum from the trenches to form wrinkles in the membrane in which hills and valleys are alternately formed along the trenches.

The membrane is preferably made of an inelastic material.

The membrane may include a semiconductor layer, a dielectric layer or a piezoelectric layer. In this case, the membrane further includes a support layer supporting the semiconductor layer, dielectric layer or piezoelectric layer. That is, the membrane has a multilayer structure.

The trench substrate may be prepared by forming a silicon oxide patterned layer on a silicon substrate such that portions of the surface of the silicon substrate are exposed. Spaces formed in the silicon oxide patterned layer serve as the trenches and the membrane may include a single crystal silicon layer and a silicon oxide layer.

The trench substrate may be prepared by etching the silicon substrate through the silicon oxide patterned layer as an etch mask. In this case, the etched portions of the silicon substrate may also serve as the trenches.

The handling substrate is preferably separated and removed at atmospheric pressure such that the membrane is depressed into the trenches by the difference between the internal and external pressures of the trenches.

The annealing is preferably performed at atmospheric pressure.

The vacuum of the trenches is removed by removing portions of the membrane or the trench substrate to form communication portions in the membrane or the trench substrate such that the trenches communicate with the outside through the communication portions.

The method may further include isolating the trenches from the outside after removal of the vacuum from the trenches.

The membrane device of the present invention can be used as a sensor due to its ability to detect a change in the surrounding environment when the shape of the wrinkles is changed.

The membrane of the membrane device according to the present invention may include a semiconductor layer. In this case, the membrane device of the present invention can be used in a laser emitting device.

The membrane of the membrane device according to the present invention may include a semiconductor layer with improved carrier mobility. In this case, the membrane device of the present invention can be applied to a high-speed semiconductor device.

In the membrane device of the present invention, the membrane has wrinkles formed along trenches. The membrane device of the present invention can be used in various applications (for example, sensors) based on variations in the electrical properties of the membrane caused by a change in the shape of the wrinkles (a change in the strain) of the membrane in response to a change in the internal or external environment of the trenches.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described in detail with reference to the accompanying drawings. These embodiments are provided to assist in understanding the invention and it will be evident to those skilled in the art that various modifications can be made to the embodiments without departing from the scope and spirit of the invention. Accordingly, the embodiments should not be construed as limiting the scope of the invention.

Structure

Figure 1:
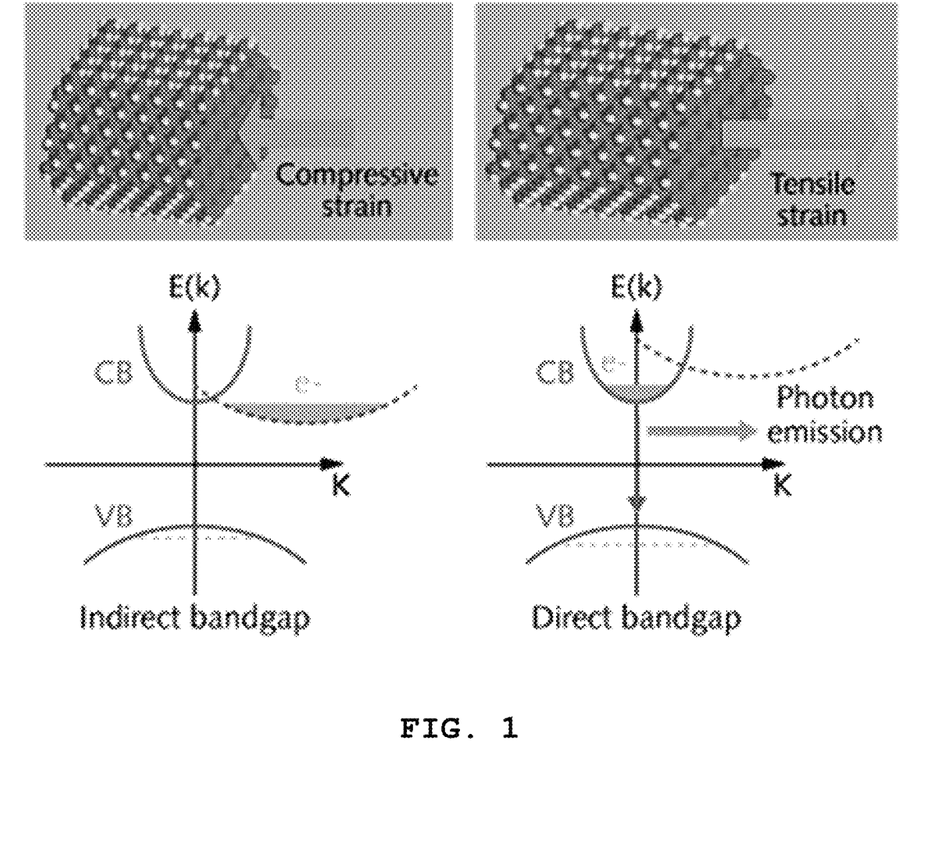
FIG. 1 is a diagram for explaining changes in energy band gap caused by lattice strains.
Figure 2A:
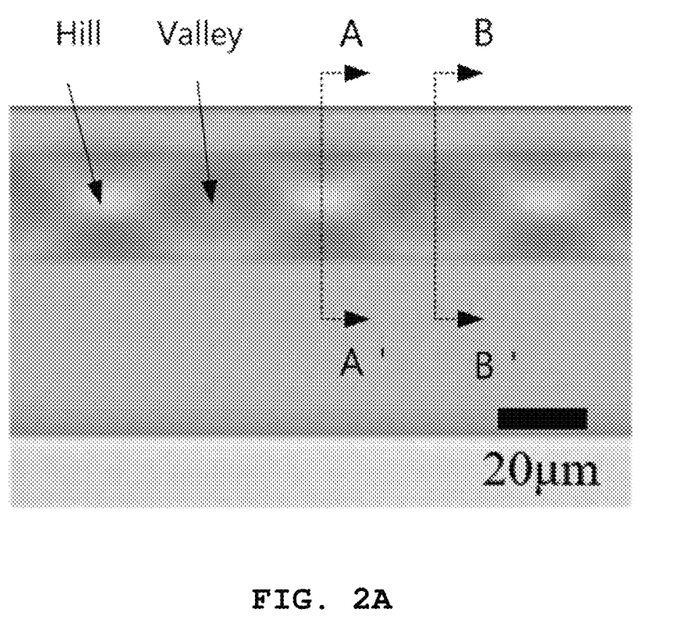
FIGS. 2A to 2C illustrate a membrane device of the present invention.
Figure 2B:
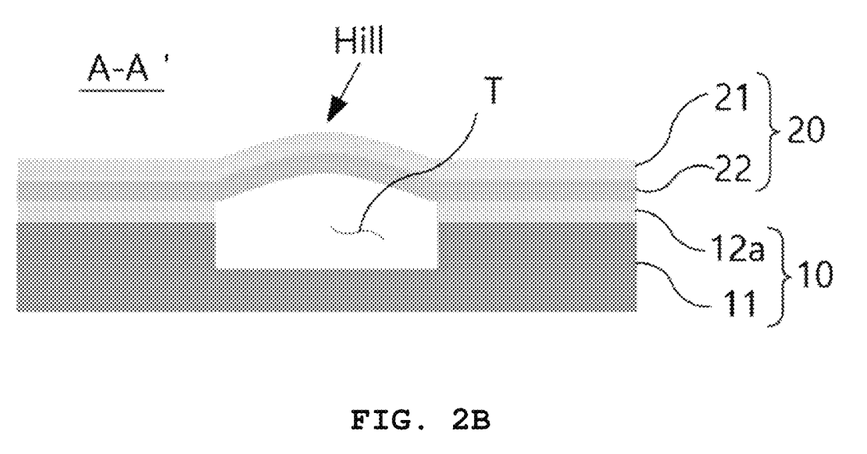
Figure 2C:
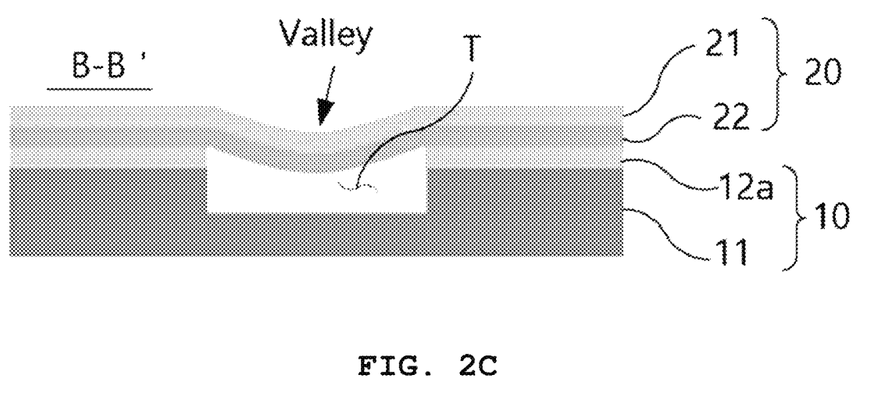

FIGS. 2A to 2C illustrate a membrane device of the present invention. Specifically, FIG. 2A is a plan-view image of the membrane device, FIG. 2B is a side cross-sectional view taken along line A-A' of FIG. 2A, and FIG. 2C is a side cross-sectional view taken along line B-B' of FIG. 2A.

Referring to FIGS. 2A to 2C, the membrane device of the present invention has a structure in which a membrane 20 is bonded to a trench substrate 10.

The trench substrate 10 may be prepared by any suitable method for forming trenches T. As exemplified in FIGS. 2A to 2C, the trench substrate 10 can be prepared by forming a silicon oxide patterned layer 12a on a silicon substrate 11 such that portions of the surface of the silicon substrate 11 are exposed and etching the silicon substrate 11 through the silicon oxide patterned layer 12a as an etch mask to form trenches T.

The membrane 20 is not bonded to the trench substrate 10 in portions where the trenches T are formed but is bonded to the surface of the trench substrate 10 in a portion where the trenches T are not formed. The membrane 20 has a structure in which no wrinkles are formed in the portion where the membrane 20 is bonded to the trench substrate 10 and hills and valleys are alternately arranged along the trenches T to form wrinkles in the portions where the membrane 20 is not bonded to the trench substrate 10.

The principle of wrinkle formation in the membrane 20 is as follow.

Since the membrane 20 is not bonded in the trenched areas T, it is suspended without sagging in the areas T. However, the membrane 20 bonded to the surface of the trench substrate in the shoulders of the trenches T remains fixed. When external artificial stress is applied to the portions of the membrane 20 in the trenched areas T, a strain is induced in the portions of the membrane 20 suspended without sagging to slightly stretch the portions of the membrane 20. Thereafter, when the stress is removed, the stretched portions of the membrane 20 made of an inelastic material fail to return to their original flat state and are deformed corresponding to the new stress-free situation to form wrinkles. The shape of the wrinkles is determined depending on the thickness and material of the membrane 20, the width/length/depth of the trenches T, and the difference between the internal and external pressures of the trenches T.

In view of the above, the membrane 20 is preferably made of an inelastic material. The kind of the inelastic material is not limited so long as its electrical properties vary depending on the strain. The inelastic material can be selected from semiconductors, dielectrics, and piezoelectrics.

When the membrane 20 includes a semiconductor, dielectric or piezoelectric layer made of an inelastic material, it is preferable that the membrane 20 further includes a support layer supporting the semiconductor, dielectric or piezoelectric layer that tends to be brittle due to its susceptibility to bending. FIGS. 2A to 2C exemplify a multilayer structure of the membrane 20 that consists of a single crystal silicon layer 22 as a semiconductor layer and a silicon oxide layer 21 as a support layer.

It is preferable that the membrane 20 has a small thickness suitable for wrinkling. If the membrane 20 is excessively thick, wrinkles are difficult to form. Meanwhile, if the membrane 20 is excessively thin, it is not resistant to bending, thus being prone to breakage. Taking into consideration the formation of wrinkles in the stack structure of the single crystal silicon layer 22 and the silicon oxide layer 21, it is preferable that the single crystal silicon layer 22 has a thickness of 110 to 250 nm and the silicon oxide layer 21 has a thickness of 120 to 135 nm.

The trenches T may be isolated from or in communication with the outside.

When the trenches T are isolated from the outside, the internal environment of the trenches T may be different from the external environment. For example, when the external pressure of the trenches T is changed, a difference may arise between the internal and external pressures of the trenches T. This difference changes the shape of the wrinkles of the membrane 20.

The shape change of the wrinkles causes a change in the strain of the membrane 20, indicating that the electrical properties of the membrane 20 vary. Based on this principle, the membrane device of the present invention can be used as a pressure sensor.

Portions of the trench substrate 10 or the membrane 20 may be removed to form holes through which the trenches T communicate with the outside. In this case, the internal environment of the trenches T is the same as the external environment thereof. That is, there is no difference between the internal and external pressures of the trenches T. Even when there is no difference between the internal and external pressures of the trenches T, the membrane 20 may be wrinkled based on the same principle as stated above.

Figure 3A:
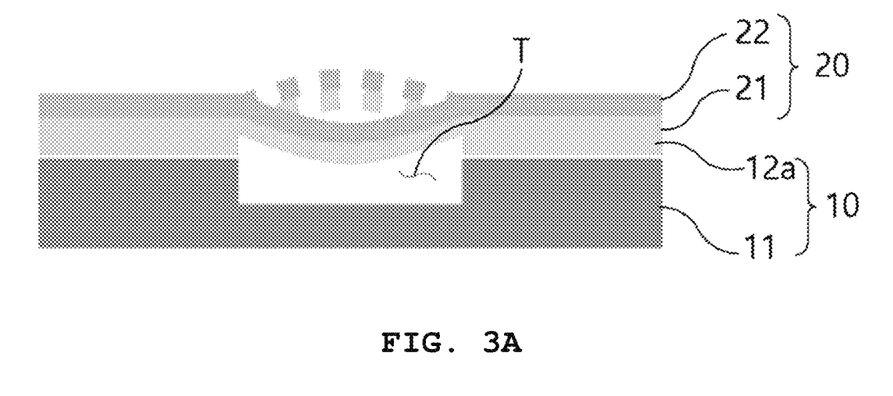
FIGS. 3A to 3C illustrate various possible structures of a membrane device according to the present invention.
Figure 3B:
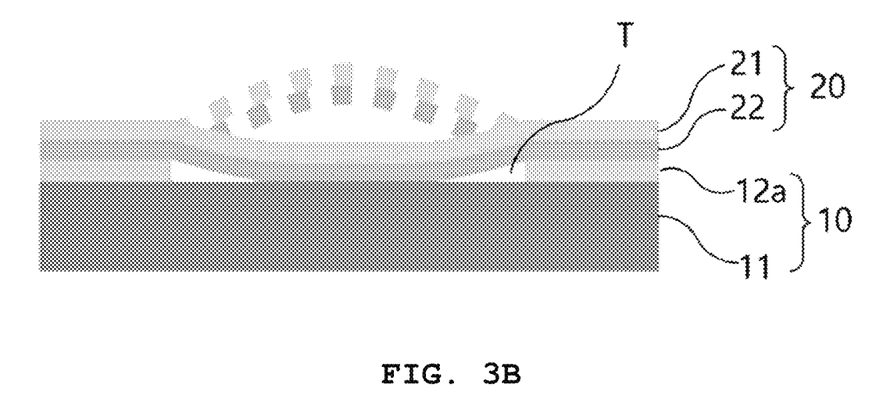
Figure 3C:
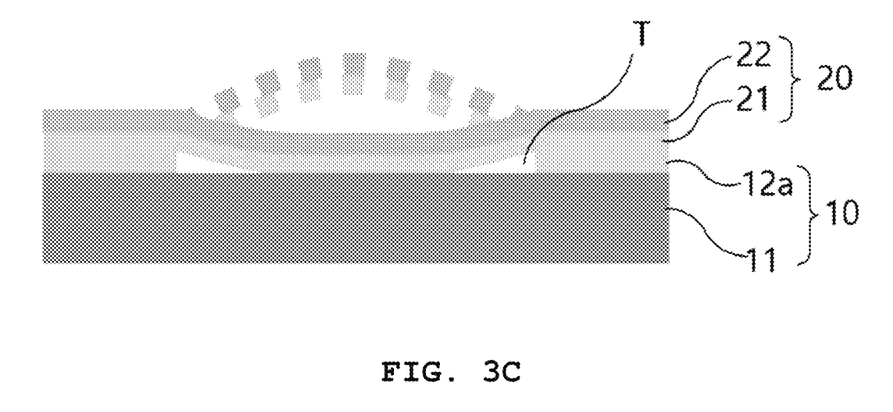

FIGS. 3A to 3C illustrate various possible structures of the membrane device according to the present invention.

As exemplified in FIGS. 2A to 2C, when the membrane 20 has a multilayer structure including the single crystal silicon layer 22 as a semiconductor layer and the silicon oxide layer 21 as a support layer, the single crystal silicon layer 22 is bonded to the trench substrate 10. Alternatively, the silicon oxide layer 21 may be bonded to the trench substrate 10, as illustrated in FIG. 3A.

In FIGS. 2A to 2C, the etched portions of the silicon substrate 11 are used as the trenches T. In contrast, spaces formed in the silicon oxide patterned layer 12a may also be utilized as the trenches T without the need to etch the silicon substrate 11, as illustrated in FIGS. 3B and 3C.

Figure 4A:
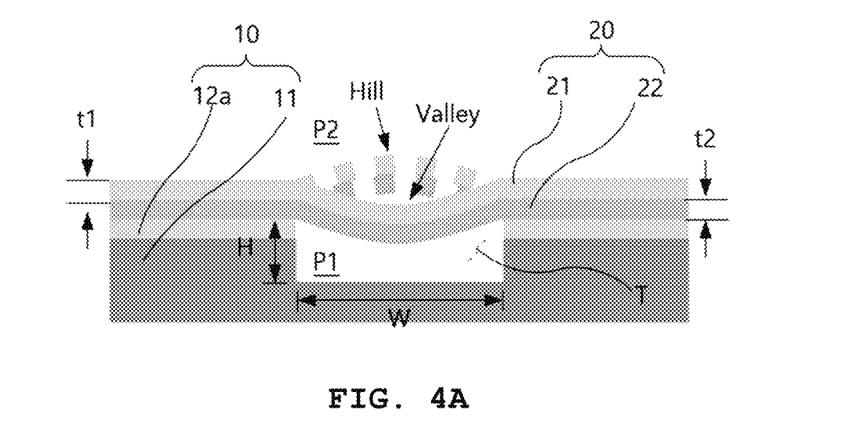
FIGS. 4A and 4B explain factors affecting the shape of wrinkles formed in a membrane of a membrane device according to the present invention.
Figure 4B:
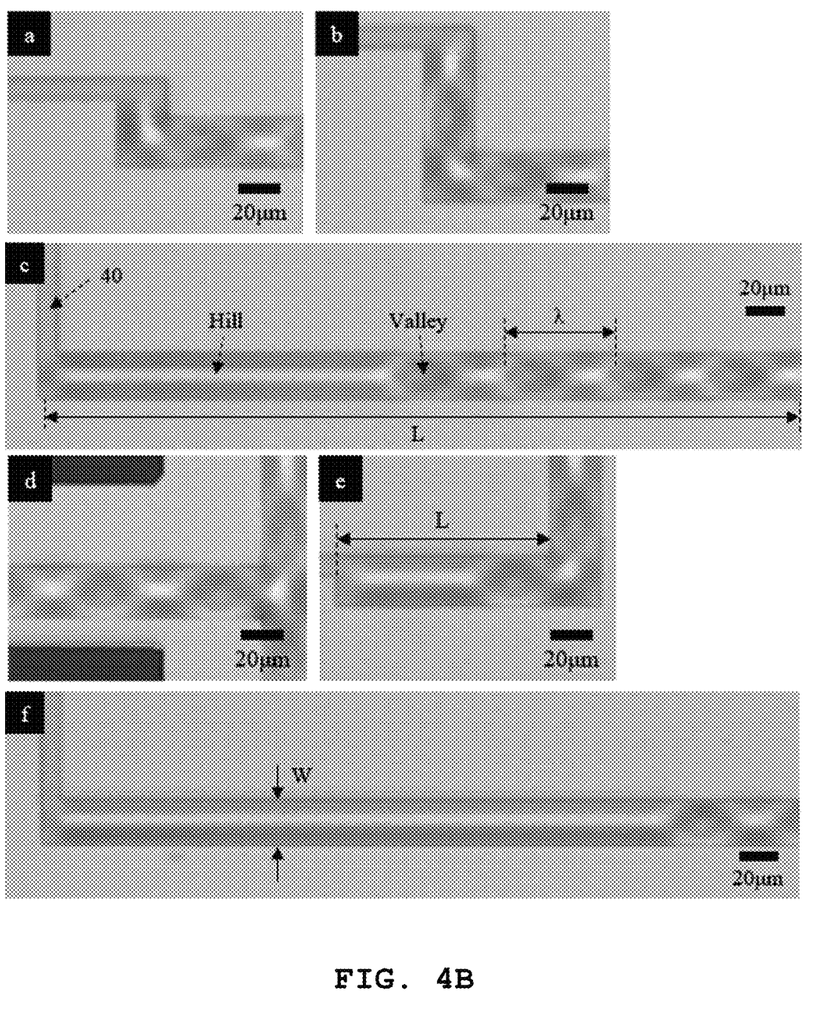

FIGS. 4A and 4B explain factors affecting the shape of the wrinkles formed in the membrane of the membrane device according to the present invention.

A stress field distributed in the membrane 20 induces a strain in the membrane 20 to form the wrinkles. Thus, the wrinkling of the membrane 20 may be affected by the following factors: (1) the thicknesses t1 and t2 and materials of the constituent layers 21 and 22 of the membrane 20, (2) the width W, length L, depth H, and shape of the trenches T, and (3) the difference between the internal and external pressures of the trenches T (P1-P2). Control over these factors enables the adjustment of the wrinkle wavelength (λ) and strain of the membrane 20.

Photographs of various possible shapes of the wrinkles formed in the membrane 20 under the influence of these factors are shown in FIG. 4B. Reference numeral 40 denotes vacuum control channels through which the trenches T communicate with the outside.

Fabrication Method

Figure 5:
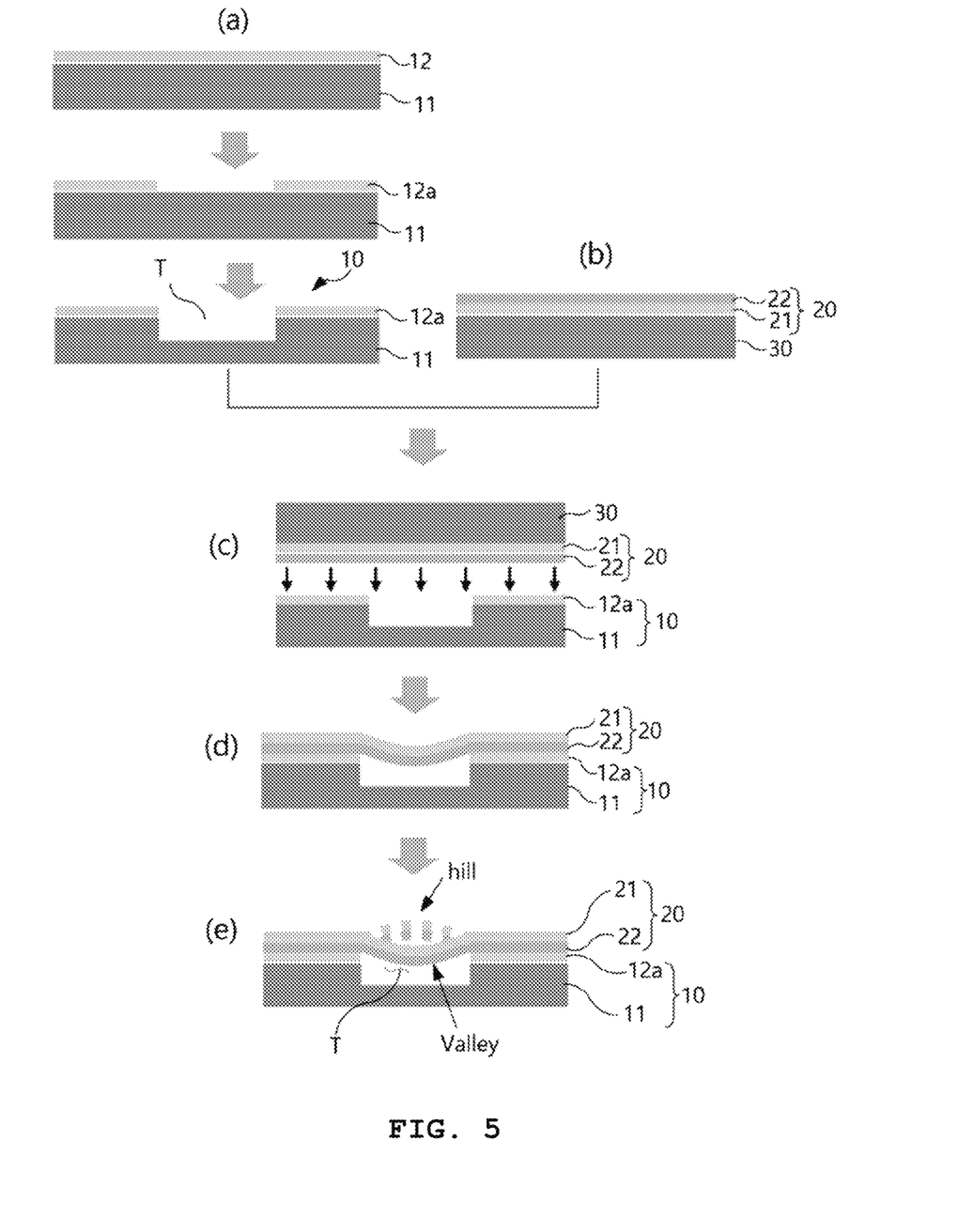
FIG. 5 illustrates a method for fabricating the membrane device of FIGS. 2A to 2C.

FIG. 5 illustrates a method for fabricating the membrane device of FIGS. 2A to 2C.

First, a silicon oxide layer 12 is formed on a silicon substrate 11, the silicon oxide layer 12 is patterned to form a silicon oxide patterned layer 12a through which portions of the surface of the silicon substrate 11 are exposed, and the silicon substrate 11 is etched through the silicon oxide patterned layer 12a as an etch mask to obtain a trench substrate 10 having trenches T formed in the silicon substrate 11, as illustrated in (a) of FIG. 5.

Separately from the preparation of the trench substrate 10, a silicon oxide layer 21 as a support layer and a single crystal silicon layer 22 as a semiconductor layer are sequentially formed on a handling substrate 30 to prepare a multilayer membrane 20, as illustrated in (b) of FIG. 5. Since the single crystal silicon layer 22 does not grow on the polycrystalline silicon oxide layer 21, the membrane 20 is preferably prepared by a smart cut technique, as illustrated in FIGS. 6A to 6D.

In the case where a polycrystalline silicon layer is used as a semiconductor layer instead of the single crystal silicon layer 22, a change in the orientation of grains in response to a strain is impossible to predict, making it difficult to impart reliability to variations in the electrical properties of the membrane 20 in response to the strain. Therefore, it is preferable that single crystal silicon is used as a material for the semiconductor layer.

Hereinafter, an explanation will be given of a smart cut technique with reference to FIGS. 6A to 6D.

Figure 6A:
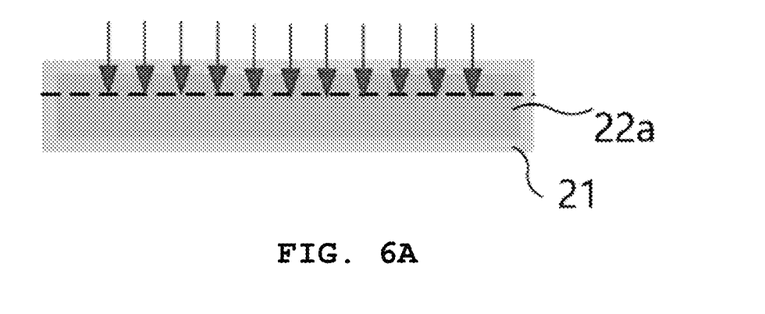
FIGS. 6A to 6D illustrate a smart cut technique.

First, the surface of a single crystal silicon substrate 22a is oxidized to form a silicon oxide layer 21 thereon and ions are injected to a predetermined depth from the surface of the single crystal silicon substrate 22a to form a smart cut boundary at the predetermined depth, as illustrated in FIG. 6A.

The ions are preferably hydrogen ions that can easily penetrate the single crystal silicon substrate 22a. The ion injection causes damage to the lattice structure of the single crystal silicon substrate 22a, facilitating subsequent cutting of the single crystal silicon substrate 22a at the boundary where the ions are injected.

Figure 6B:
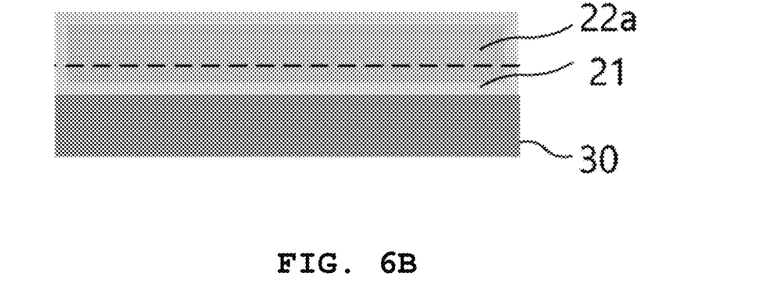

Subsequently, the single crystal silicon substrate 22a is bonded to a handling substrate 30, as illustrated in FIG. 6B. Specifically, the silicon oxide layer 21 formed on the ion-injected surface of the single crystal silicon substrate 22a is bonded to the handling substrate 30. A silicon substrate is preferably used as the handling substrate 30 for easy bonding with the silicon oxide layer 21.

Figure 6C:
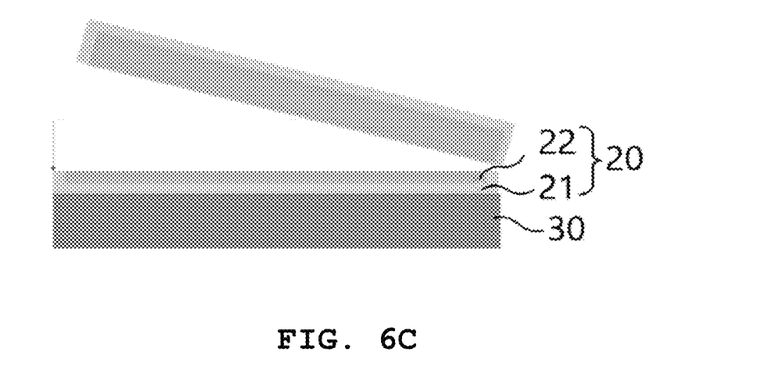
Figure 6D:
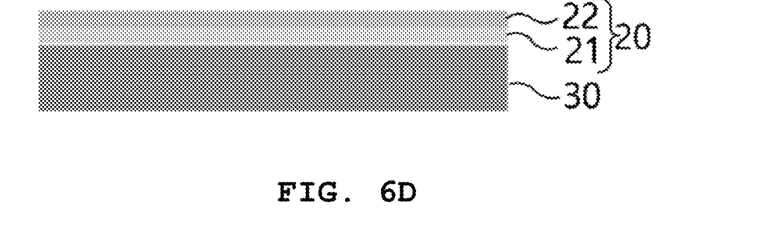

Thereafter, the single crystalline silicon substrate 22a is removed along the smart cut boundary, as illustrated in FIG. 6C. The resulting structure consists of the silicon oxide layer 21 and the single crystal silicon layer 22 sequentially formed on the handling substrate 30, as illustrated in FIG. 6D.

Also when the silicon oxide layer 21 is formed on the handling substrate 30 instead of on the single crystalline silicon substrate 22a, the same structure can be obtained using the smart cut technique.

Referring again to FIG. 5, the explanation will be continued.

The handling substrate 30 is bonded to the trench substrate 10 under vacuum in a state in which the membrane 20 faces the trench substrate 10 such that the trenches T are evacuated to a vacuum, as illustrated in (c) of FIG. 5. As a result, the membrane 20 is not bonded to the trenches T of the trench substrate 20 but is bonded to the surface of the trench substrate 10 in the shoulders of the trenches T to obtain a structure in which the trenches T are evacuated to a vacuum.

Thereafter, annealing is performed such that the single crystal silicon layer 22 of the handling substrate 30 and the silicon oxide patterned layer 12a of the trench substrate 10 are physically or chemically firmly bonded to each other. For this annealing, the resulting vacuum-bonded structure may be transferred to an annealing system. Although the annealing is performed at atmospheric pressure, the vacuum state of the trenches T is maintained. Thus, the annealing is performed at atmospheric pressure, which is advantageous in terms of cost.

Subsequently, the handling substrate 30 is separated and removed from the membrane 20, as illustrated in (d) of FIG. 5. It is preferable to separate and remove the handling substrate 30 at atmospheric pressure. Although the trenches T are evacuated to a vacuum, the handling substrate 30 serves as a support to prevent the membrane 20 from being depressed into the trenches T. Thus, after separation and removal of the membrane 20 at atmospheric pressure, a difference arises between the internal and external pressures of the trenches T, with the result that a strain is induced to depress the thin handling substrate 30 into the trenches T.

Next, the vacuum of the trenches T is removed, as illustrated in (e) of FIG. 5. As a result, the internal pressure of the trenches T is the same as the external pressure, leaving the membrane 20 in a situation where a new stress field is produced.

At this time, the membrane 20 made of an inelastic material fails to return to its original flat state and the strain induced in (d) of FIG. 5 is transformed into a new strain. The new strain leads to the formation of wrinkles in the membrane 20 in which hills and valleys are alternately arranged along the trenches T.

As mentioned earlier, the shape of the wrinkles is determined depending on the thickness and material of the membrane 20, the width/length/depth of the trenches T, and the difference between the internal and external pressures of the trenches T.

The vacuum of the trenches T is removed by removing portions of the membrane 20 or the trench substrate 10 to form communication portions (not illustrated) in the membrane 20 or the trench substrate 10. The trenches communicate with the outside through the communication portions.

The trenches T are connected to the communication portions through the channels 40 illustrated in FIG. 4B.

Although not illustrated, the method may further include isolating the trenches T from the outside after the step illustrated in (e) of FIG. 5. This isolation can be achieved by closure of the communication portions.

Figure 7:
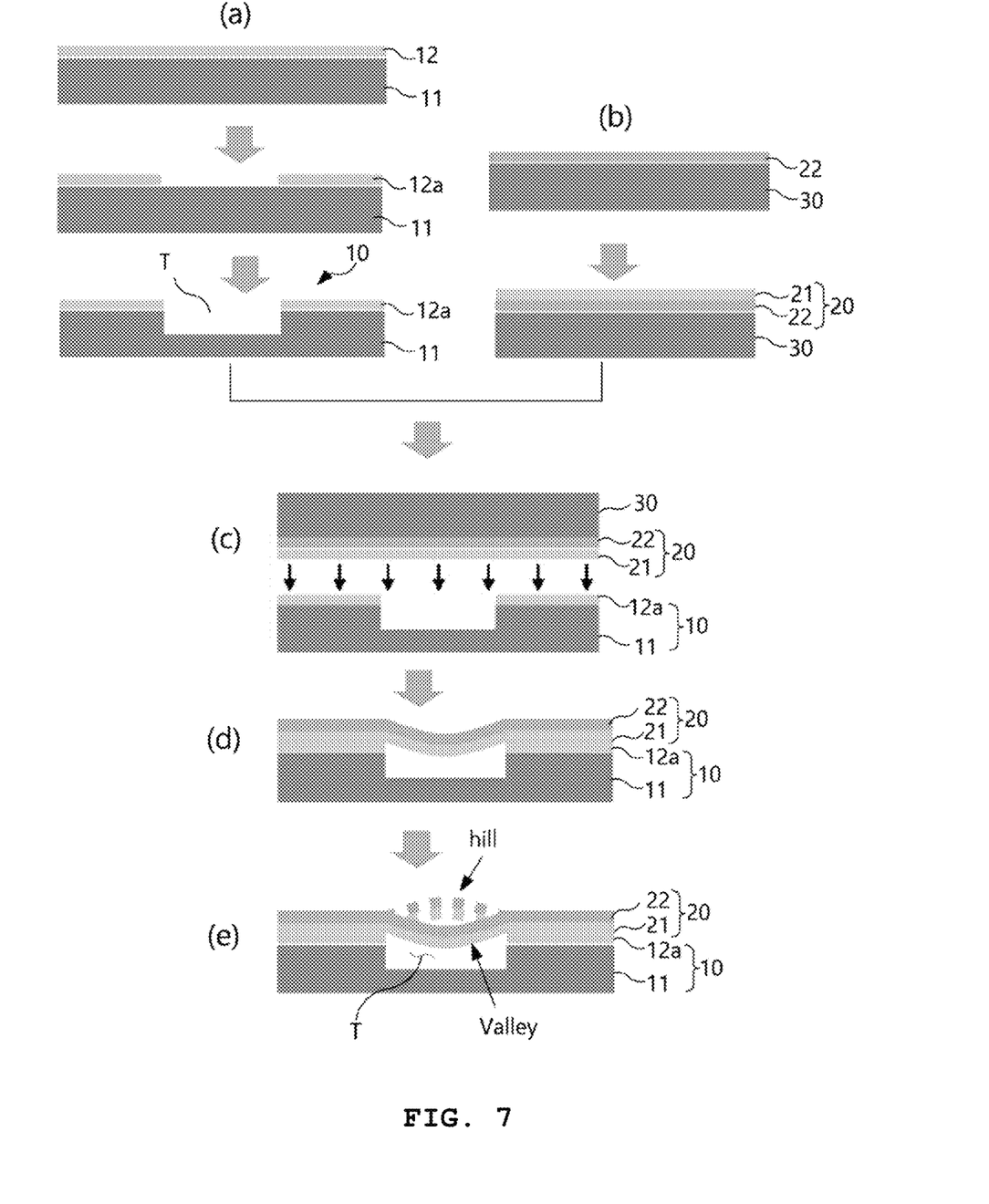
FIG. 7 illustrates a method for fabricating the membrane device of FIG. 3A.

FIG. 7 illustrates a method for fabricating the membrane device of (a) of FIG. 3. The layers of the membrane 20 illustrated in FIG. 7 are stacked in the reverse order to those of the membrane 20 illustrated in FIG. 5. Specifically, the silicon oxide layer 21 rather than the single crystal silicon layer 22 is bonded to the silicon oxide patterned layer 12a of the trench substrate 10 under vacuum in the method of FIG. 7.

Figure 8:
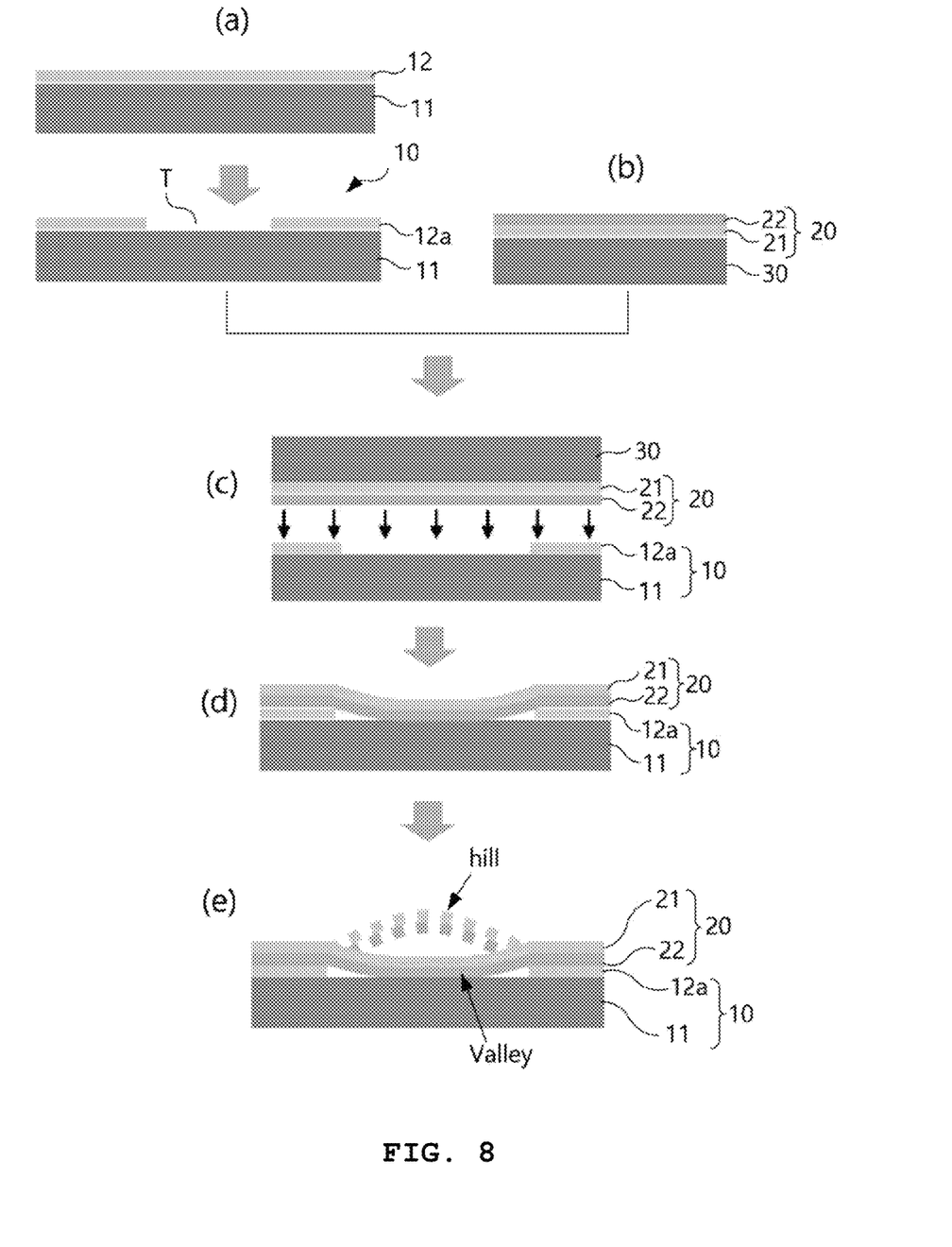
FIG. 8 illustrates a method for fabricating the membrane device of FIG. 3B.

FIG. 8 illustrates a method for fabricating the membrane device of (b) of FIG. 3. The method of FIG. 8 is different from the method of FIG. 5 in that spaces formed in the silicon oxide patterned layer 12a are utilized as the trenches T without the need to etch the silicon substrate 11.

Figure 9:
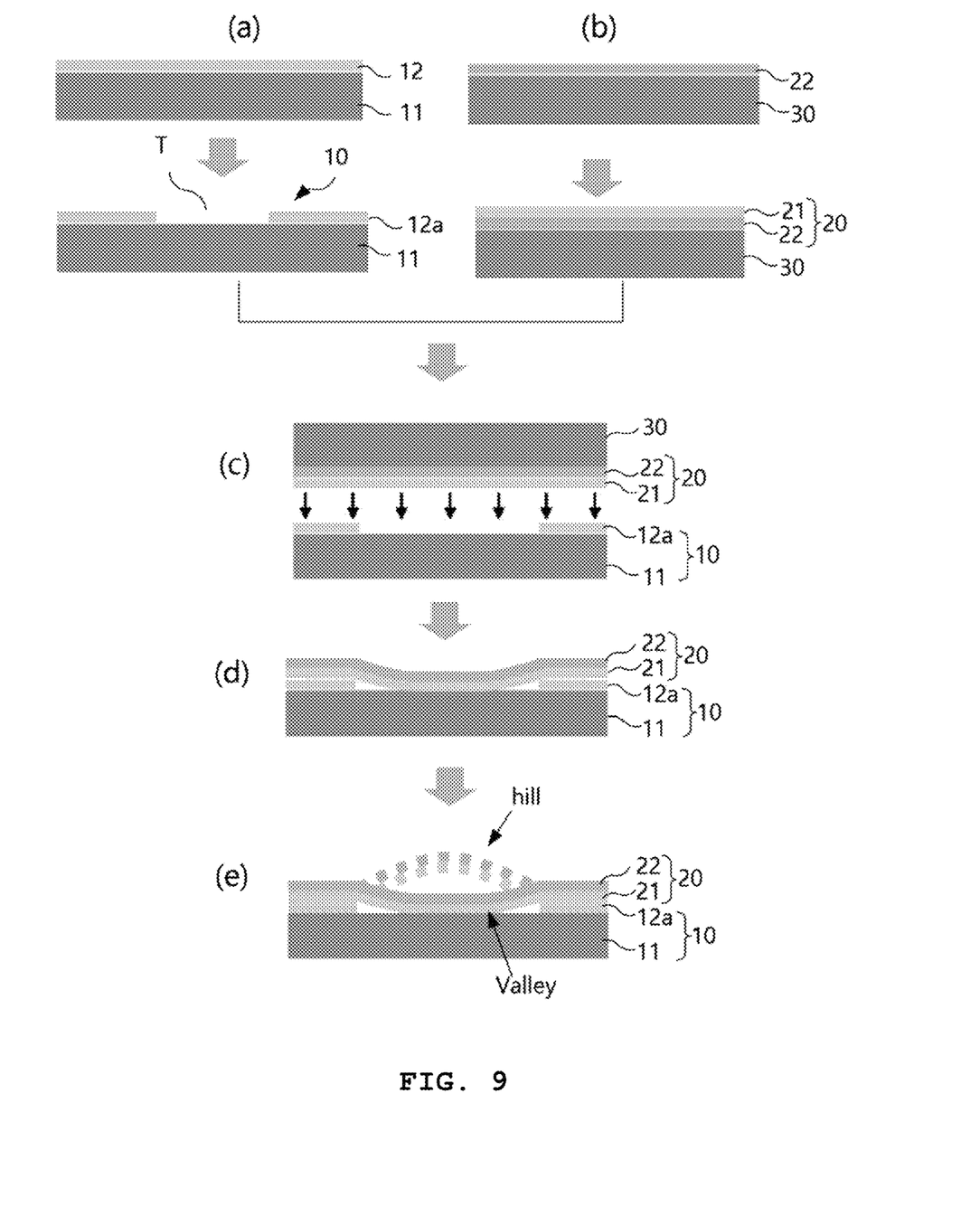
FIG. 9 illustrates a method for fabricating the membrane device of FIG. 3C.

FIG. 9 illustrates a method for fabricating the membrane device of (c) of FIG. 3. The layers of the membrane 20 illustrated in FIG. 9 are stacked in the reverse order to those of the membrane 20 illustrated in FIG. 5. The method of FIG. 9 is different from the method of FIG. 5 in that spaces formed in the silicon oxide patterned layer 12a are utilized as the trenches T without the need to etch the silicon substrate 11.

Applications

1. Pressure Sensor

A change in the difference between the internal and external pressures of the trenches T changes the shape of the wrinkles (e.g., wrinkle wavelength) formed in the membrane 20, which indicates a change in the strain of the membrane 20. As a result, variations in the electrical properties of the membrane 20 are induced. The pressure change can be detected by measuring the variations in the electrical properties.

2. Gas Sensor

A material is bound to the membrane 20 to cause a change in strain, and as a result, the shape of the wrinkles formed in the membrane 20 is changed. Based on this principle, the membrane device of the present invention can be utilized as a gas sensor.

3. Haptic/Fingerprint Sensor

The membrane device of the present invention is provided in plurality and a 2-dimensional array of the membrane devices can be used as a haptic/fingerprint sensor.

4. Biosensor

When a layer to which a biomaterial can be bound is formed on the membrane 20, the strain of the membrane is changed in response to the binding of the biomaterial to change the shape of the wrinkles. Based on this principle, the membrane device of the present invention can be applied to a biosensor.

5. High-Speed Semiconductor Transistor

The electron and hole mobilities of the semiconductor layer can be improved through a strain induced in the membrane 20. Based on this principle, the membrane device of the present invention can be applied to a high-speed semiconductor transistor.

6. Laser/LED

Various strains can be induced in the membrane 20 by various methods, for example, by changing the internal pressure of the trenches T, to control the energy band gap. Based on this principle, the membrane device of the present invention can be utilized in a wavelength-tunable laser system capable of emitting lasers at various wavelengths. In addition, a transition from an indirect semiconductor to a direct one enables the production of lasers.

As is apparent from the foregoing, the membrane 20 of the membrane device according to the present invention has wrinkles formed along the trenches T. The membrane device of the present invention can be used in various applications (for example, sensors) based on variations in the electrical properties of the membrane 20 caused by a change in the shape of the wrinkles (a change in the strain) of the membrane 20 in response to a change in the internal or external environment of the trenches T.

What is claimed is:
1. A method for fabricating a membrane device, comprising:
   forming a membrane on a silicon handling substrate;
   bonding the handling substrate to a trench substrate having trenches under vacuum in a state in which the membrane faces the trench substrate such that the trenches are evacuated to a vacuum;
   annealing a resulting vacuum-bonded structure;
   separating and removing the handling substrate from the membrane; and
   removing the vacuum from the trenches to form wrinkles in the membrane in which hills and valleys are alternately formed along the trenches;
   wherein
   the trench substrate is prepared by forming a silicon oxide patterned layer on a silicon substrate such that portions of a surface of the silicon substrate are exposed;
   spaces formed in the silicon oxide patterned layer are provided as the trenches; and
   the membrane has a multilayer structure comprising a single crystal silicon layer and a silicon oxide layer;
   wherein the forming of the membrane comprises
      oxidizing a surface of a single crystal silicon substrate to form the silicon oxide layer of the membrane on the single crystal silicon substrate,
      injecting ions to a predetermined depth from a surface of the single crystal silicon substrate to form a smart cut boundary at the predetermined depth,
      bonding the single crystal silicon substrate to the handling substrate such that the silicon oxide layer formed on the ion-injected surface comes into contact with the handling substrate, and
      removing a first portion of the single crystalline silicon substrate along the smart cut boundary, the removing leaving a second portion of the single crystal silicon substrate as the single crystal silicon layer of the membrane; and
   wherein after the removing, a resulting structure comprises the silicon oxide layer and the single crystal silicon layer sequentially formed on the handling substrate; and
   the method further comprises bonding the resulting structure to the trench substrate with a surface of the single crystal silicon layer contacting a surface of the silicon oxide patterned layer, annealing the bonded resulting structure and the trench substrate, and separating the handling substrate from the silicon oxide layer.

2. The method according to claim 1, wherein the membrane is made of an inelastic material.

3. The method according to claim 1, wherein the handling substrate is separated and removed at atmospheric pressure such that the membrane is depressed into the trenches by a difference between the internal and external pressures of the trenches.

4. The method according to claim 1, wherein the annealing is performed at atmospheric pressure.

5. The method according to claim 1, wherein the vacuum of the trenches is removed by removing portions of the membrane or the trench substrate to form communication portions in the membrane or the trench substrate such that the trenches communicate with outside the trenches through the communication portions.

6. The method according to claim 1, further comprising isolating the trenches from outside the trenches after removal of the vacuum from the trenches.

7. The method according to claim 1, wherein the trench substrate is prepared by etching the silicon substrate through the silicon oxide patterned layer as an etch mask and etched portions of the silicon substrate are provided as the trenches.

* * * * *